(12) United States Patent
Erlesand

(10) Patent No.: US 9,249,009 B2
(45) Date of Patent: Feb. 2, 2016

(54) STARTING SUBSTRATE FOR SEMICONDUCTOR ENGINEERING HAVING SUBSTRATE-THROUGH CONNECTIONS AND A METHOD FOR MAKING SAME

(75) Inventor: Ulf Erlesand, Osterskar (SE)

(73) Assignee: SILEX MICROSYSTEMS AB, Jarfalla (SE)

( * ) Notice: Subject to any disclaimer, the term of this patent is extended or adjusted under 35 U.S.C. 154(b) by 6 days.

(21) Appl. No.: 14/112,403

(22) PCT Filed: Apr. 19, 2012

(86) PCT No.: PCT/SE2012/050420
§ 371 (c)(1),
(2), (4) Date: Oct. 17, 2013

(87) PCT Pub. No.: WO2012/144951
PCT Pub. Date: Oct. 26, 2012

(65) Prior Publication Data
US 2014/0042498 A1    Feb. 13, 2014

(30) Foreign Application Priority Data

Apr. 21, 2011  (SE) .................... 1150356-2

(51) Int. Cl.
*H01L 21/04* (2006.01)
*B81B 3/00* (2006.01)
*H01L 29/423* (2006.01)
(Continued)

(52) U.S. Cl.
CPC ........... *B81B 3/0086* (2013.01); *B81C 1/00222* (2013.01); *H01L 21/76898* (2013.01);
(Continued)

(58) Field of Classification Search
CPC ....... H01L 21/76; H01L 21/113; H01L 27/08; H01L 29/76; H01L 29/94; H01L 31/062; B81B 3/00; B81C 1/00
USPC ................. 257/135, 220–221, 241–242, 254, 257/262–263, 302, 325–334, 341, 369, 257/430; 438/135–138, 173, 192–195, 206, 438/212, 268
See application file for complete search history.

(56) References Cited

U.S. PATENT DOCUMENTS 6,373,097 B1 * 4/2002 Werner .................. 257/329
2007/0020926 A1   1/2007 Kalvesten et al.
(Continued)

FOREIGN PATENT DOCUMENTS

| JP | 2003101012 A | 4/2003 |
| SE | 526 366 C2 | 8/2005 |
| WO | 2004/084300 A1 | 9/2004 |
| WO | 2007/089207 A1 | 8/2007 |
| WO | 2007089206 A1 | 8/2007 |

OTHER PUBLICATIONS

International Search Report, dated Jul. 3, 2012, from corresponding PCT application.

*Primary Examiner* — Fernando L Toledo
*Assistant Examiner* — Lawrence-Linh T Nguyen
(74) *Attorney, Agent, or Firm* — Young & Thompson

(57) ABSTRACT

A substrate-through electrical connection (10) for connecting components on opposite sides of a substrate, and a method for making same. The connection includes a substrate-through via made from substrate material (10'). There is a trench (11) provided surrounding the via, the walls of the trench being coated with a layer of insulating material (12) and the trench (11) is filled with conductive or semi-conductive material (13). A doping region (15) for threshold voltage adjustment is provided in the via material in the surface of the inner trench wall between insulating material (12) and the material (10') in the via. There are contacts (17', 17") to the via on opposite sides of the substrate, and a contact (18) to the conductive material (13) in the trench (11) so as to enable the application of a voltage to the conductive material (13).

13 Claims, 12 Drawing Sheets

(51) Int. Cl.
*H01L 29/66* (2006.01)
*H01L 29/78* (2006.01)
*H01L 21/768* (2006.01)
*H01L 23/48* (2006.01)
*B81C 1/00* (2006.01)

(52) U.S. Cl.
CPC .......... *H01L23/481* (2013.01); *H01L 29/4236* (2013.01); *H01L 29/66666* (2013.01); *H01L 29/7827* (2013.01); *H01L 2924/0002* (2013.01)

(56) References Cited

U.S. PATENT DOCUMENTS

| | | | |
|---|---|---|---|
| 2009/0152611 A1* | 6/2009 | Fujimoto | 257/296 |
| 2009/0236660 A1* | 9/2009 | Takahashi | H01L 29/1095 257/334 |
| 2010/0032764 A1* | 2/2010 | Andry et al. | 257/369 |
| 2010/0052107 A1* | 3/2010 | Bauer | H01L 21/76898 257/621 |

* cited by examiner

STARTING SUBSTRATE FOR SEMICONDUCTOR ENGINEERING HAVING SUBSTRATE-THROUGH CONNECTIONS AND A METHOD FOR MAKING SAME

The present invention relates to means and methods for providing vias for starting substrate wafers for semiconductor engineering, where the contact resistance in the interface between metal contact pads and the wafer vias will be reduced.

BACKGROUND OF THE INVENTION

Applicants own Swedish patent SE-0300784-6 (publication number 526 366) discloses and claims through-connections (also referred to as vias) made in a wafer material from the native wafer itself. The vias thereby comprises the same material as the remainder of the wafer and will thus be capable of being processed in a more versatile manner, as describe in detail in said patent, the disclosure of which is incorporated herein in its entirety by reference.

However, for certain applications the resistivity that is attainable in these prior art vias may be too high, and it would be desirable to provide vias with very low resistivity.

It is known to provide vias made of metal, but the conventional methods used (sputtering, plating, or evaporation methods) are all suffering from the problem that it is difficult to fill very small holes with them. Metal vias only allows via last processes (e.g. CMOS structures must be made before via formation).

A general problem addressed in WO2007/089207 is that on one hand it is desirable to have substrates (wafers) having low resistivtiy electrical through-connections (vias). This requires that the starting substrate for making the vias exhibits a low resistivity, e.g. it is highly doped.

On the other hand electronic circuits are made in high resistivity materials (such as non-doped silicon). It is desirable to connect the circuits made on one side of a wafer with structures on the other side using vias of the type mentioned.

These two requirements and preconditions are contradictory. The invention according to WO2007/089207 provides methods for solving this problem.

In U.S. Pat. No. 6,373,097 there is disclosed a field-effect-controllable vertical semiconductor component, and a method for producing the same. The component includes a semiconductor body having at least one drain region of a first conduction type, at least one source region of the first conduction type, at least one body region of a second conduction type between the drain regions and the source regions, and at least one gate electrode insulated from the entire semiconductor body by a gate oxide. A gate terminal and a drain terminal are located on a front side of the wafer, and a source terminal is located on a rear side of the wafer. A monolithically integrated half bridge with a low-side switch and a high-side switch includes the field-effect-controllable vertical semiconductor component and a conventional field-effect-controllable vertical semiconductor component.

SUMMARY OF THE INVENTION

However, for certain applications it is further desirable or even required that there be provided an "on-off" function in wafer-through vias of the type described above, and the present invention provides a via structure enabling such "on-off" function.

In another aspect, the same basic via structure is provided in a high resistivity substrate, i.e. with a low doping, which makes it possible to build components such as resistances, diodes, transistors etc in the substrate, i.e. to monolithically integrate them in a high resistivity substrate, and still provide a low resistivity via for connecting components on both sides of the wafer, by setting the via in an "on" state.

Thus, the object of the present invention is to provide a new method for making electrical through-connections (vias) for a wafer that has the above mentioned on-off capability.

The novel method is defined in claim 1.

In one aspect there is provided a structure in the form of a substrate-through electrical connection (10) for connecting components on opposite sides of said substrate. This new structure is defined in claim 6.

In another aspect there is provided a starting substrate for semiconductor engineering in general, i.e. further processing to make and package various kinds of electronic circuits and/or components and/or for MEMS applications enabling such "on-off" function in the final product. This aspect is defined in claim 12.

In a still further aspect there is provided for introducing the novel structure in MEMS devices. Thus, a MEMS device incorporating the novel structure is defined in claim 13.

BRIEF DESCRIPTION OF THE DRAWINGS (In the figures hatching of the cross-sections has been avoided for clarity)

DETAILED DESCRIPTION OF THE INVENTION

Figure 1:
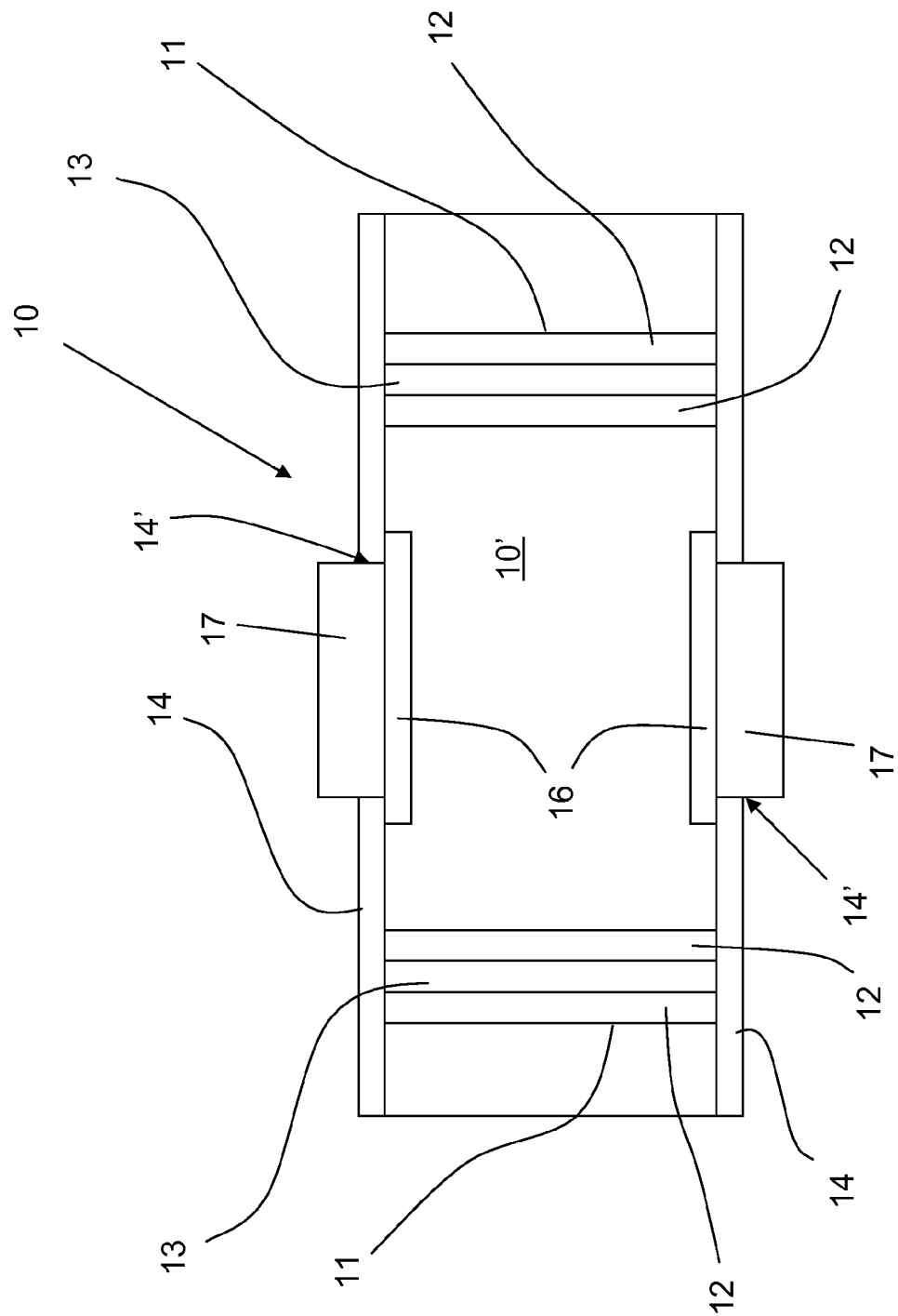
FIG. 1 shows in cross-section a conventional via structure 10 comprising a wafer-recess.

For the purpose of this invention the term "semiconductor engineering" shall be taken to mean any processing on semiconductor wafers, i.e. further processing of wafer material to make various kinds of circuits, components and/or devices, electronic circuits and/or components and/or MEMS applications.

When the terms "wafer" or "substrate" are used below they should be taken to mean both entire wafers such as 6-8 inch diameter wafers, as well as diced wafers, i.e. individual chips, cut from wafers.

For the purpose of this application "doped" does not necessarily mean that dopant has been introduced by purpose. A "doped" substrate may well be a native material, i.e. as supplied, since it is virtually impossible to manufacture even single-crystalline products without any trace of doping materials present. If dopant has been introduced into a material in a particular operation, as described in the following description, it will be indicated that it is the case.

The present invention relates to a method for providing electrical wafer-(or substrate-)through connections, below referred to as vias, for CMOS wafers, and wherein there is provided an on-off function so as to enable passing current through the vias by applying a voltage to the via that is equal to or larger than a threshold voltage.

It also relates to wafers and substrates comprising such vias having an on-off function.

Thus, according to the invention there is provided a method of making an substrate-through electrical connection having an on-off function, comprising providing a semiconductor substrate, etching trenches to define said substrate-through electrical connection, doping the trench walls, filling the trenches with a conductive or semi-conductive material, doping the substrate-through electrical connection on a respective side of the substrate with an opposite doping type to that of the substrate, providing contacts to the substrate-through electrical connection on each side of the substrate, said having the same doping as the contacts, providing contact(s) to the trench material on one side of the substrate, whereby the contacts to the substrate-through electrical connection form source and drain contacts, respectively, of a transistor, and the contact(s) to the trench material form(s) gate contacts of a transistor.

The substrate-through electrical connection 10 for connecting components on opposite sides of said substrate according to the invention comprises a substrate-through via made from substrate material 10', wherein a trench 11 surrounding said via, the walls of said trench being coated with a layer of insulating material 12 and wherein the trench 11 has been filled with conductive or semi-conductive material 13, a threshold voltage adjustment doping region 15 in the via material in the surface of the inner trench wall between insulating material 12 and the material 10' in the via, contacts 17', 17" to the via on opposite sides of the substrate, and a contact 18 to the conductive material or semi-conductive material 13 in the trench 11 so as to enable the application of a voltage to the conductive material or semi-conductive material 13.

FIG. 1 shows a conventional via structure 10 comprising a wafer-through recess or trench 11, the walls of which are coated with an oxide layer 12 and wherein the trench has been filled with poly-silicon 13. The part of the wafer enclosed/encircled by the filled trench constitutes the wafer-through via made from doped wafer native material 10'. The wafer is also coated with an oxide layer 14 through which there have been made openings 14' by etching so as to expose a portion of the top and bottom surfaces, respectively, of the via. Through these openings there has been doping material 16 introduced into the via by suitable means to provide a better contact to the metal in the contact. Thus, finally, a contact metal layer 17 has been deposited over the opening in the oxide layer so as to provide a low ohmic electrical contact.

Figure 2:
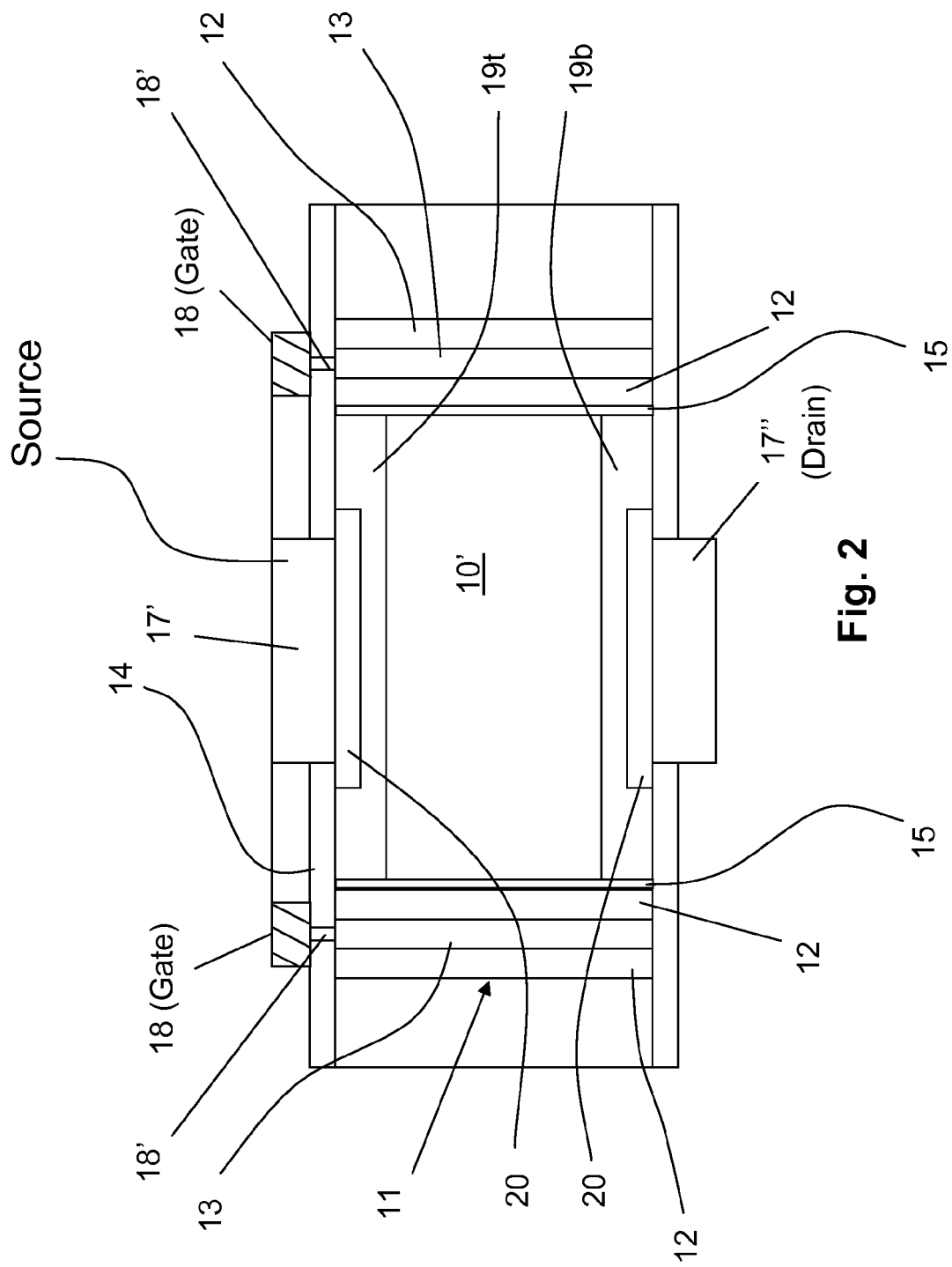
FIG. 2 shows in cross-section one embodiment of the invention, namely a via structure having an on-off function when no voltage V is applied.

In FIG. 2 one embodiment of the invention is disclosed, namely a via structure having an on-off function, i.e. wherein the via can be made conductive or non-conductive as desired. The main constitution of this embodiment is the same as that of the structure shown in FIG. 1, and like elements will have the same reference numerals as in FIG. 1.

However, here, apart from the contacts 17', 17" to the via itself, there are also made contacts 18 through the top oxide layer 14 (as seen in the figure) above the trench 11 so as to enable the application of a voltage to the poly silicon 13 in the trench 11. The contacts are suitably provided along the entire trench, i.e. if the via is circular, the contact 18 will be provided as a ring contact. This contact 18 will function as a gate in transistor terminology. Suitably the connection through the oxide layer 14 from the poly silicon 13 in the trench to the contact 18 is provided by opening holes 18' in the oxide 14 and filling with conductive material, e.g. metal, and then by suitable means providing the contact 18 material.

Furthermore, according to the invention, there is provided a doped top and bottom section 19t, 19b, respectively, in the via, which has the opposite type of doping compared to the via material itself. In this oppositely doped region there is a contact doping 20, having the same doping type as the doped top and bottom sections 19t, 19b, respectively, and finally on top thereof a metal contact 17', 17" is deposited. The doped sections 19t and 19b form the source and drain regions of the transistor structure.

Also, there is a threshold adjustment doping region 15 (same or opposite silicon doping) in the via material in the surface of the inner trench wall between oxide and the silicon in the via. This is used for setting threshold voltage values for the device in dependence of the doping levels in the substrate 10' and via fill material 13. By changing doping (type and amount) of via trench polysilicon, different turn-on (threshold) voltages is obtained. A man skilled in the art would be able to find suitable doping type and amounts for this purpose without exercising inventive skills.

This configuration enables operation in FET mode (FET=Field Effect Transistor). Thus, the contacts 18 through the top layer 14 down to the trench 11 will be a gate, and the top contact 17' on the via will be a source, and the bottom contact 17" a drain, in accordance with transistor terminology.

Figure 3:
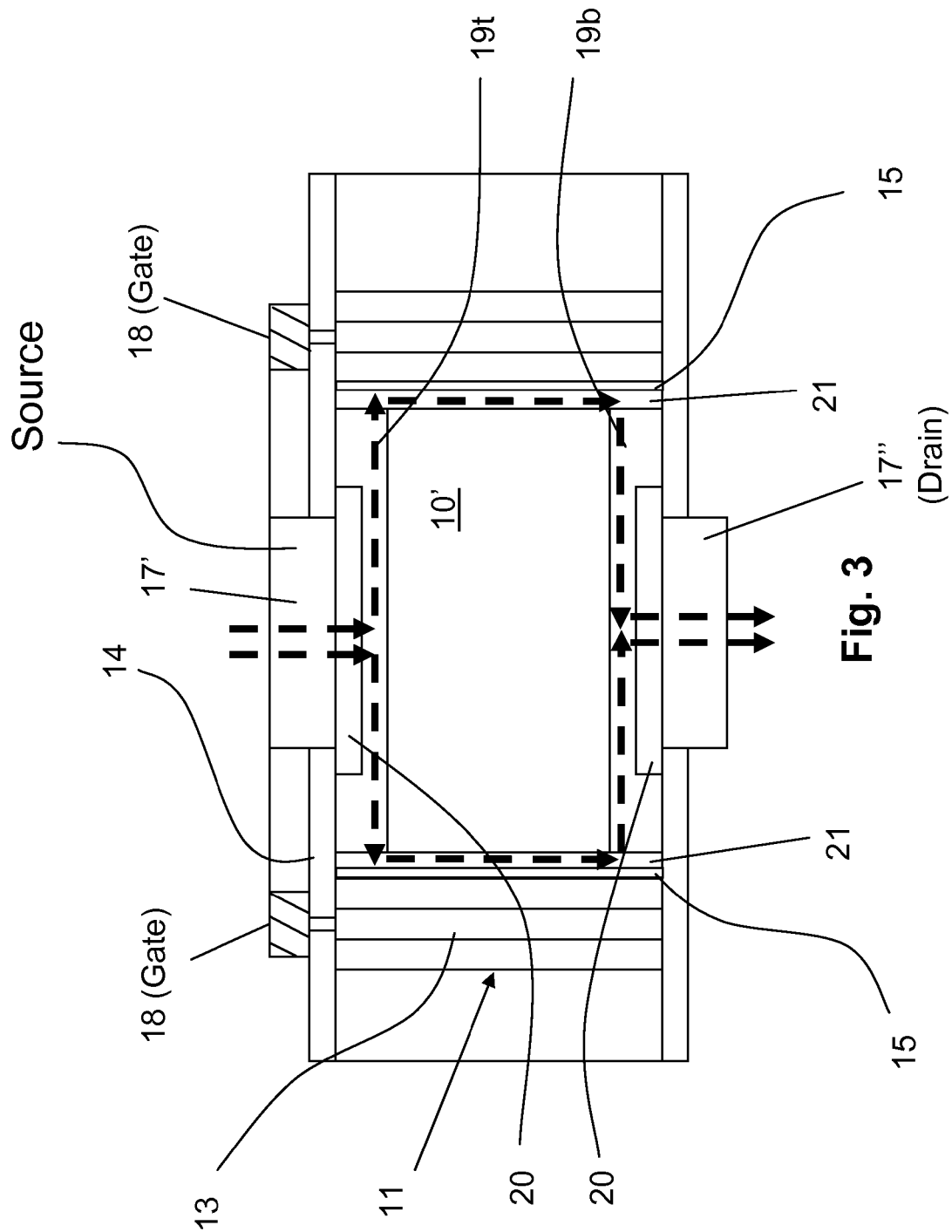
FIG. 3 shows in cross-section the situation when a voltage V higher than a threshold voltage is applied to the structure in FIG. 2.

This device is operated as follows, se FIG. 3.

If a voltage V of appropriate sign and above the threshold voltage (in accordance with transistor terminology) is applied to the poly-Si regions, i.e. to the gates 18, the voltage creates a minority carrier inversion layer 21 in the silicon region close to the oxide interface. This formed layer then facilitates the current transport between the contacts 17', 17". Current flowing in the device is indicated with broken arrows. When no inversion is provided by an applied voltage, no majority current flows between the contacts 17', 17", except for leakage generated currents in the two p/n junctions between the doped top and bottom sections 19t, 19b, and the silicon region (10').

Thus, one achieves an on/off function in the via structure.

For providing a planar substrate with such electrical through-connections, or vias, a method is used which is the subject of a co-pending International Application No. WO 2004/084300. It comprises the provision of a suitable substrate, normally a standard semiconductor wafer, commonly employed for the manufacture of various semiconductor devices. The planar substrate is preferably a semiconductor wafer, preferably selected from silicon, doped silicon, GaAs, InP, SiC etc. The wafer is normally 0.300-0.825 mm thick.

In particular the above mentioned method is applicable to cases where it is desirable to provide connections between a front side and a back side of such a wafer, where there are high demands on the resistivity in said connections to be as low as possible.

The present inventors have devised a method for providing vias in low doped substrates for CMOS wafers, where there is provided a transistor function in the via, thereby enabling an on-off function to be achieved and also making it possible to build other semiconducting devices which need low doped base material in the via substrates.

In particular of course it is necessary to design the structure such that the final transistor will have an appropriate threshold voltage for the on-off function.

This method is illustrated in FIGS. 4-12 and will be described below. Where appropriate, the same reference numerals as in FIGS. 1-3 have been used for same or similar features.

First a wafer of silicon 40 (or other suitable material) is patterned 41 for trench 42 definition. Such patterning can be performed with standard techniques of lithography etc. well known to the skilled man.

Figure 4:
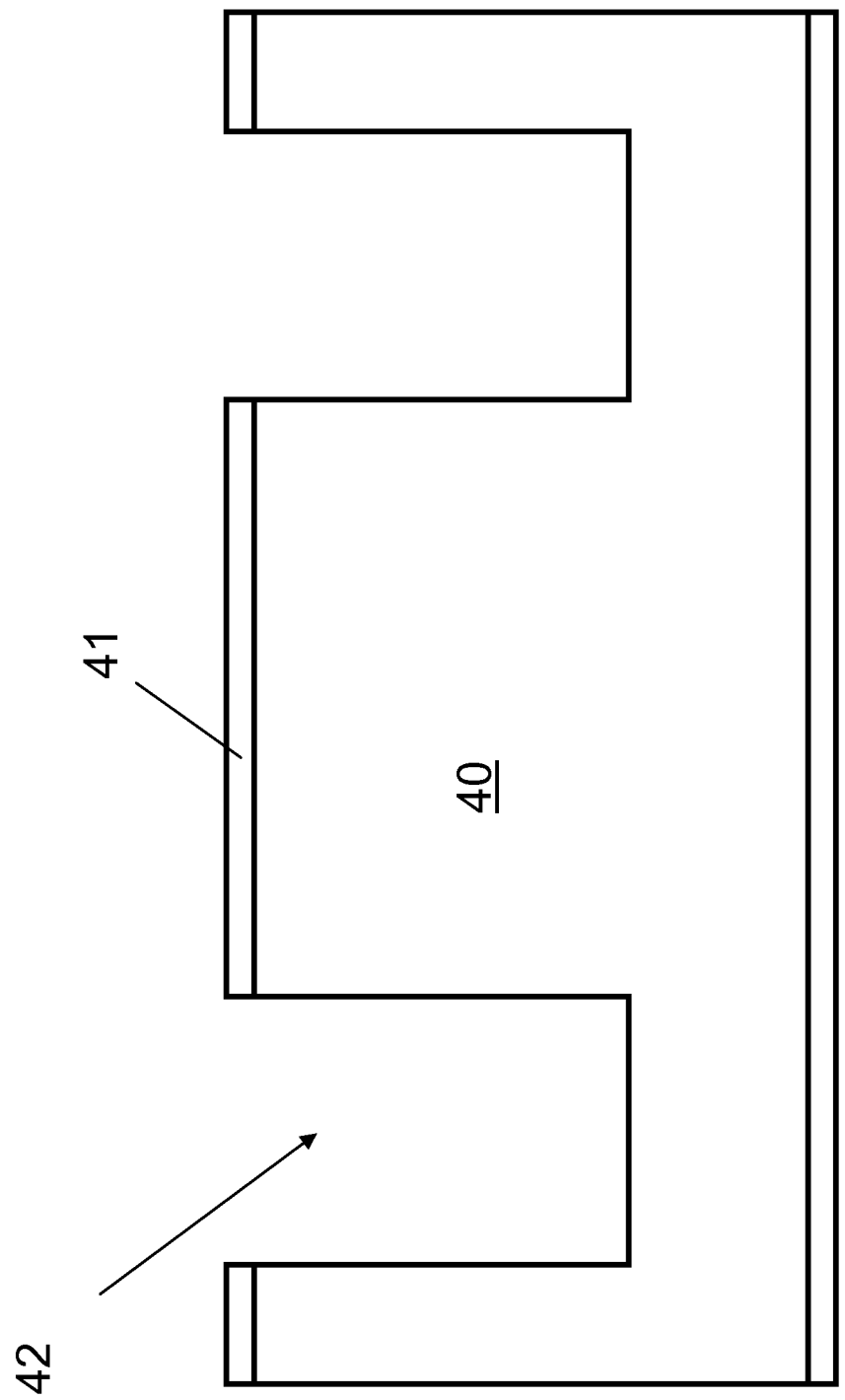
FIGS. 4-12 illustrate a process sequence for making one embodiment of a structure according to the invention.

In order to make the vias a method disclosed in applicants Swedish patent mentioned previously herein can be employed. This entails etching trenches 42, suitably by DRIE, in the wafer from the back side, after having patterned the back side of the wafer appropriately, as can be seen in FIG. 4. Reference is made to said Swedish patent for this, the disclosure of the patent being incorporated herein by reference.

Figure 5:
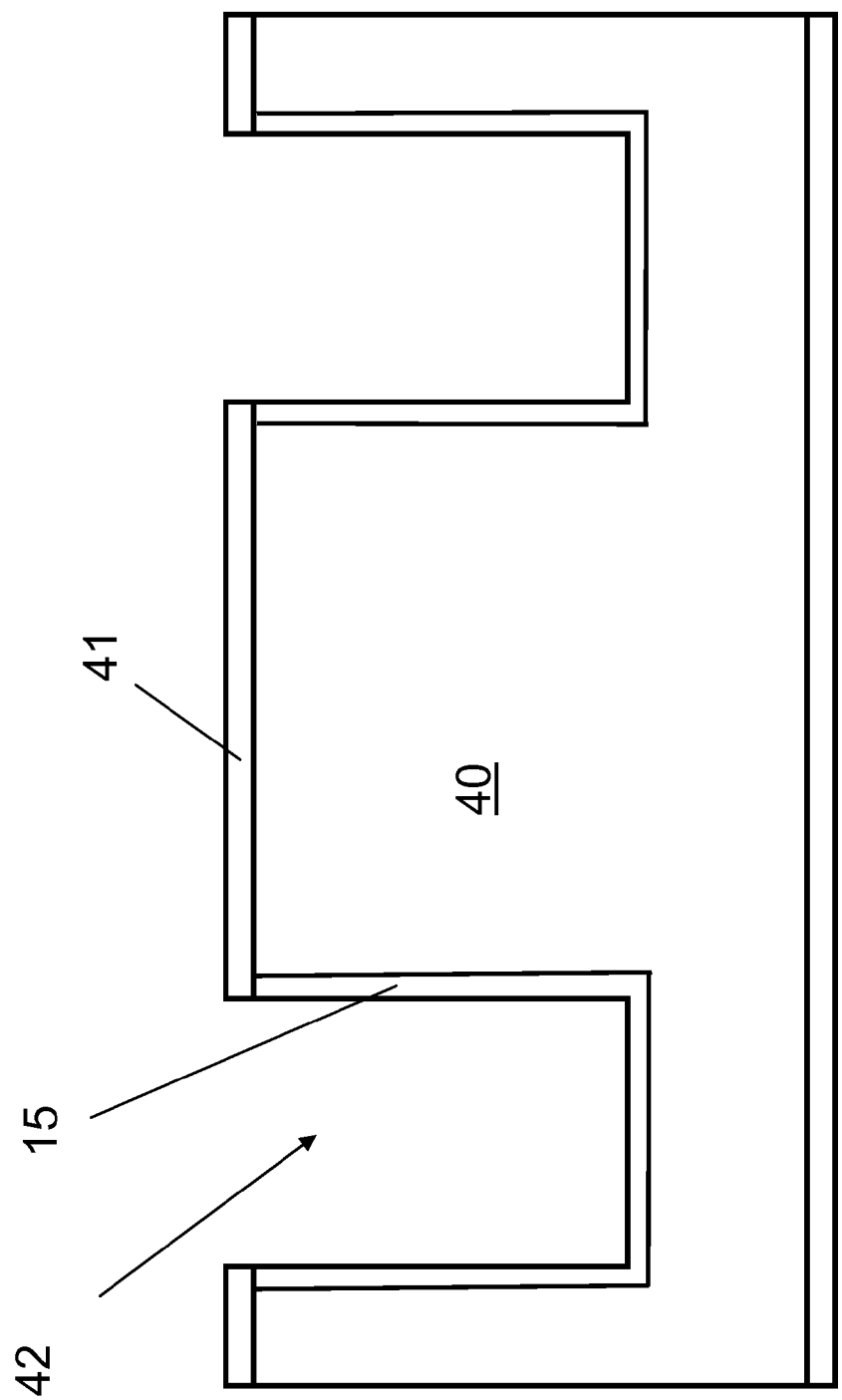
Figure 6:
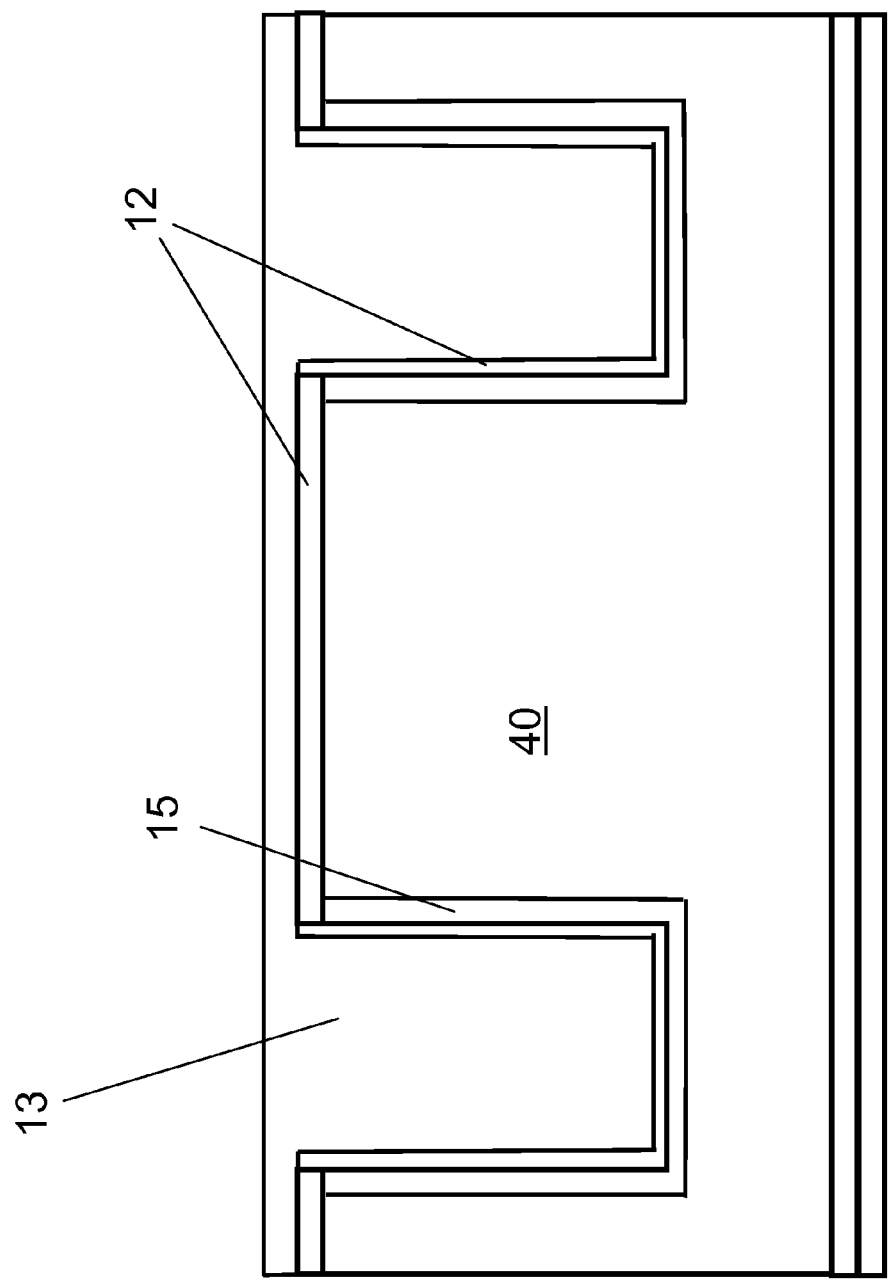

After the trench is formed by DRIE the trench walls are doped by appropriate doping material 15 see FIG. 5. This is necessary to achieve the needed threshold voltage for the final transistor. The trench doping can be performed with standard techniques of diffusion masking and dopant diffusion well known to the skilled man. The trenches 42 are then at least partially filled with a dielectric material 12 to create an insulating barrier, in FIG. 6 this barrier is shown as a layer on the walls and bottom of the trench. Thus, by partially is meant the entire trench is not filled but the side walls inside the trench must be covered. Also the front and back side of the wafer is covered with insulating material. The trench is then filled with a conducting material 13 of appropriate type to achieve the desired threshold voltage of the final transistor on-off function. The conductive material 13 can be doped polysilicon or other semiconducting material or a metal. Suitably the material in the trench is deposited by using e.g. any of the methods LPCVD, PECVD, MOCVD, PVD, ALD, electroplating or electroless plating or melting.

Figure 7:
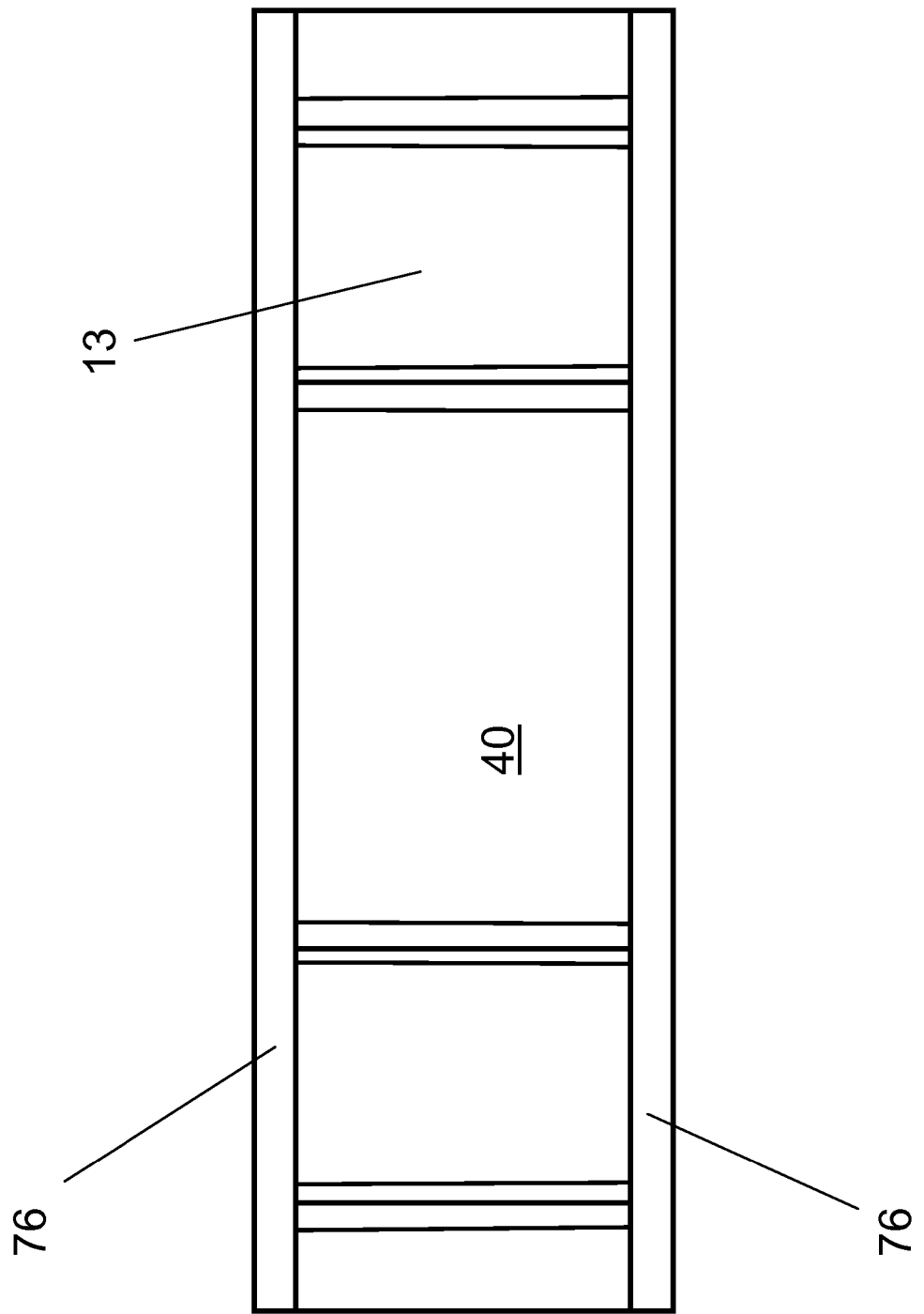
Figure 8:
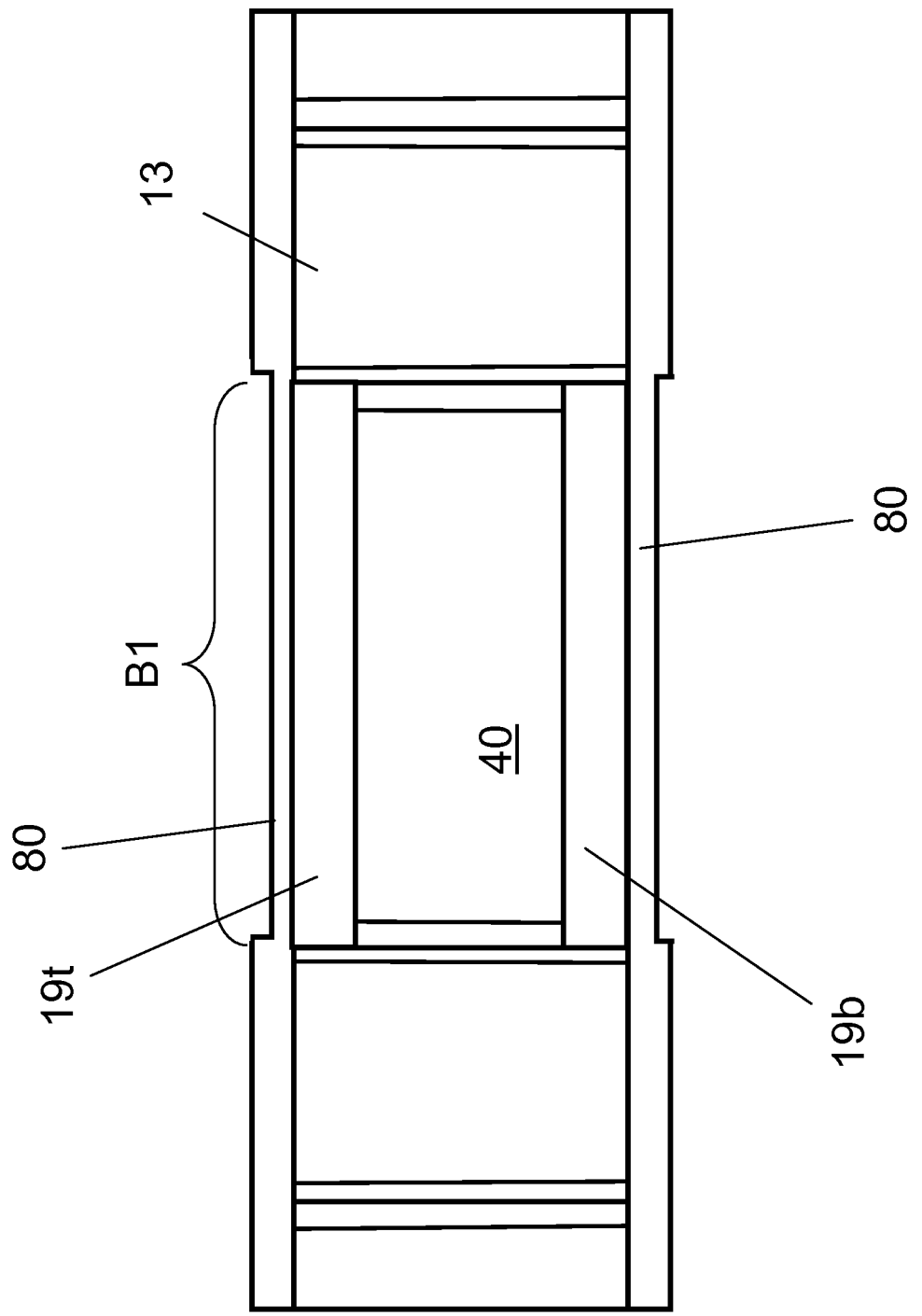

The conductive material is then removed from all areas except the trench region by standard techniques of etching and/or grinding well known to the skilled man. This is illustrated in FIG. 7 where it can be seen how the conductive material is provided only inside the area enclosed by the trench 42 and has exposed surfaces both on the upper and the bottom side of the wafer. Device isolation 76 for subsequent metallisation on both sides of the wafer is then done by standard techniques of oxidation or dielectric deposition well known to the skilled man.

Next, as shown in FIG. 8-12, the device source 17' and drain 17" and their respective contact doping 19t, 19b regions (forming source and drain regions) are then formed by standard techniques of lithography, etching and diffusion well known to the skilled man. This is done by opening up the device isolation 76 over the entire area indicated by the bracket B1 down to the via material 40 and introducing dopant into the via material 40, see FIG. 8. At the same time, since the substrate material is low doped, other semiconductor based components can be made, both inside and outside the via, by using standard techniques of lithography, etching and diffusion well known to the skilled man. It should be noted that of course the wafer is treated on one side at a time, i.e. the top side (as seen in the figure) is first processed, and then the bottom side. This is applicable for all the following process steps.

Figure 9:
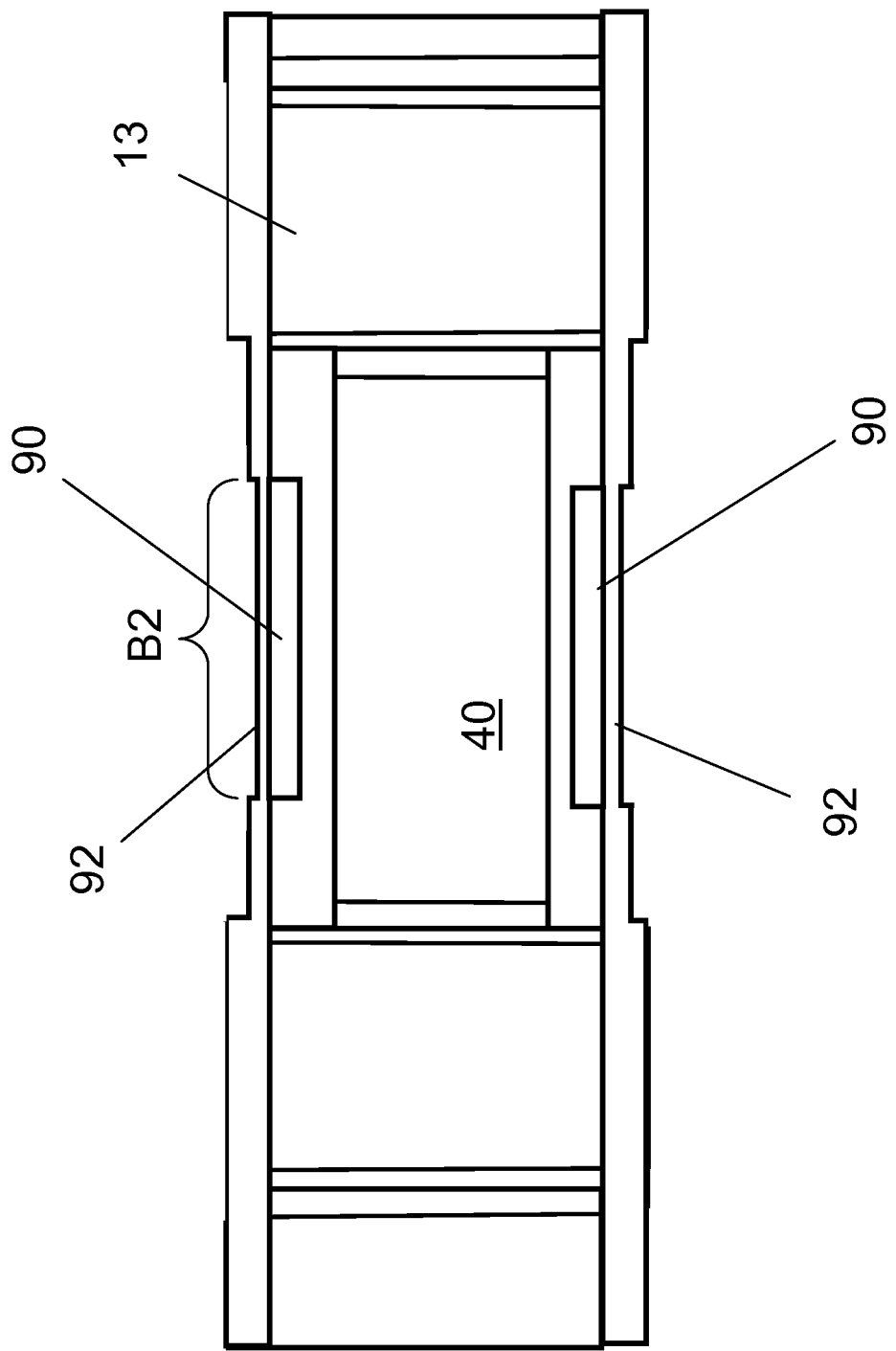
Figure 10:
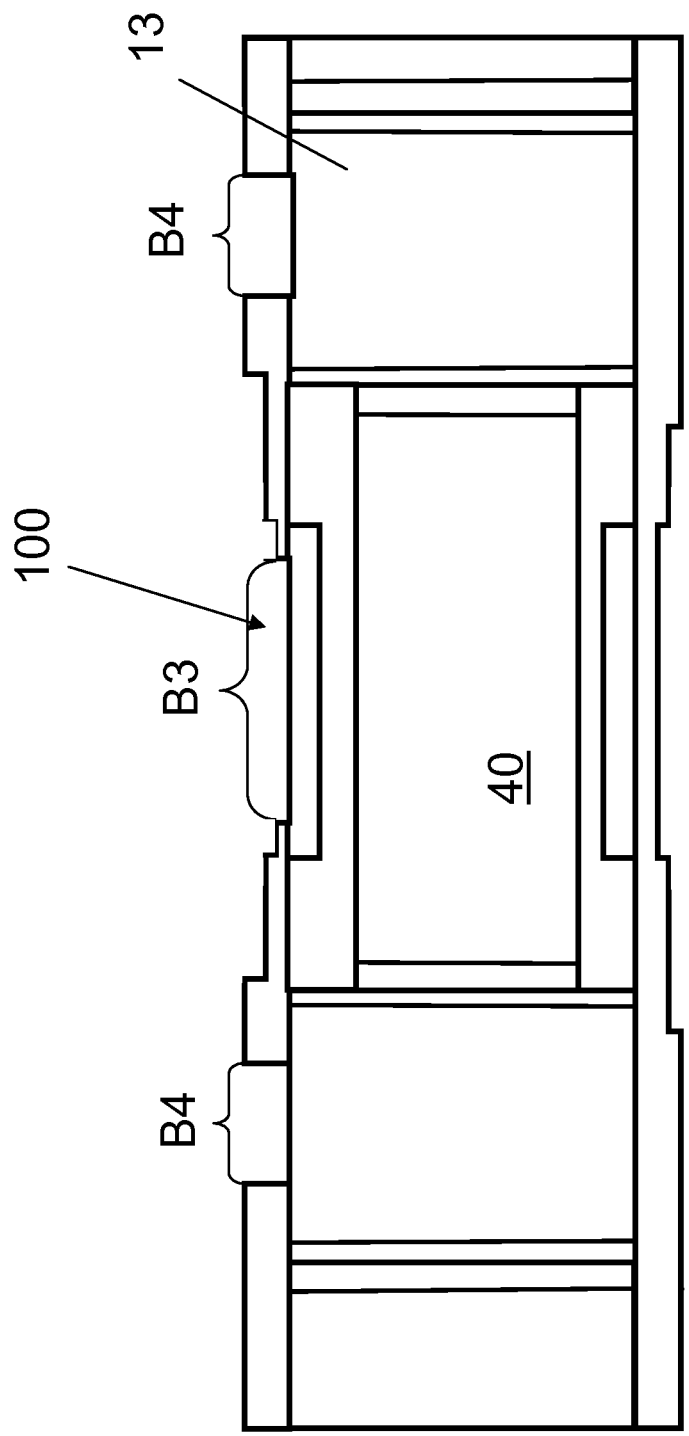

When the source and drain regions 19t, 19b have been suitably doped a device isolation layer 80 is provided over the doped regions 19t, 19b. Again a smaller area, indicated by a bracket B2 is then opened up through the layer 80 down to the via material 40, and source and drain contact doping 90 are provided by suitable doping, as shown in FIG. 9. The contact doping regions are covered with a dielectric 92 and again a smaller area 100 is opened up, indicated by bracket B3, in the layer above the source region, see FIG. 10. In the same process step, i.e. at the same time, the dielectric is opened up, shown with bracket B4, to expose the interior of the trench 42 so as to provide contacts 18 (gates).

Figure 11:
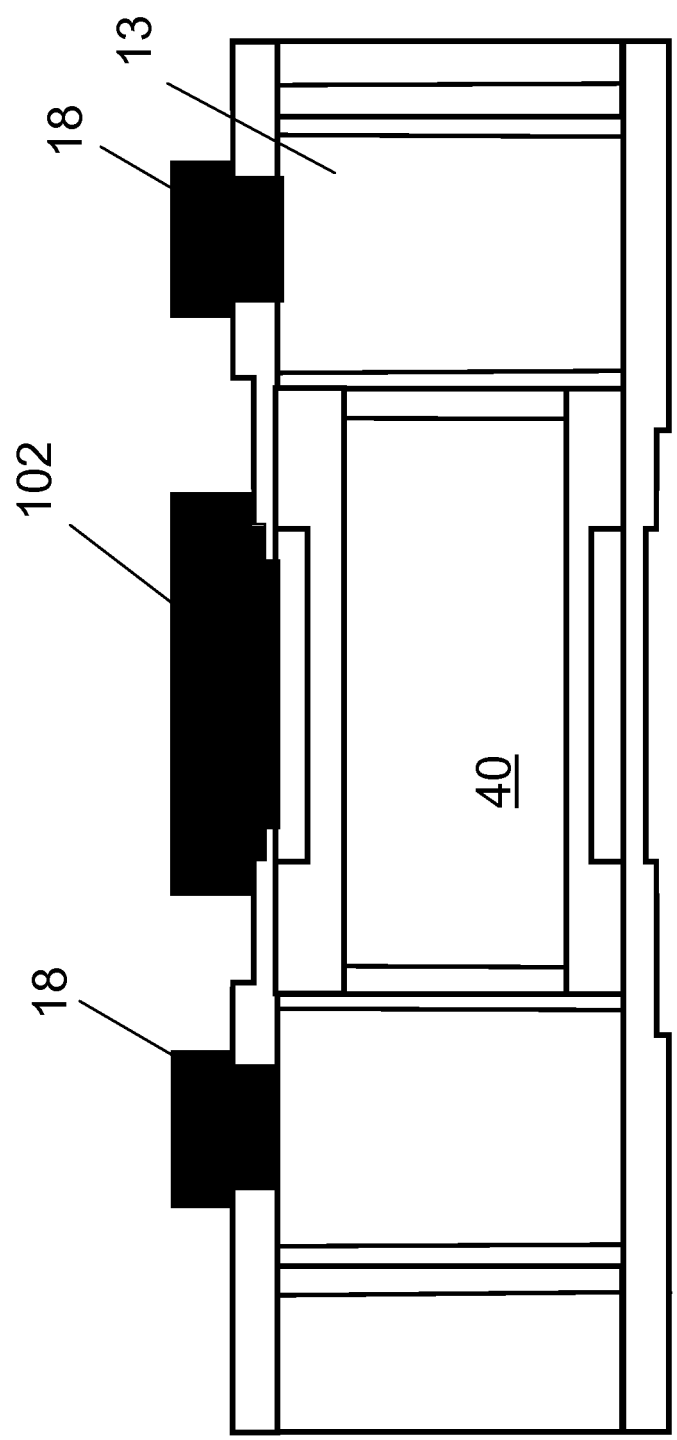
Figure 12:
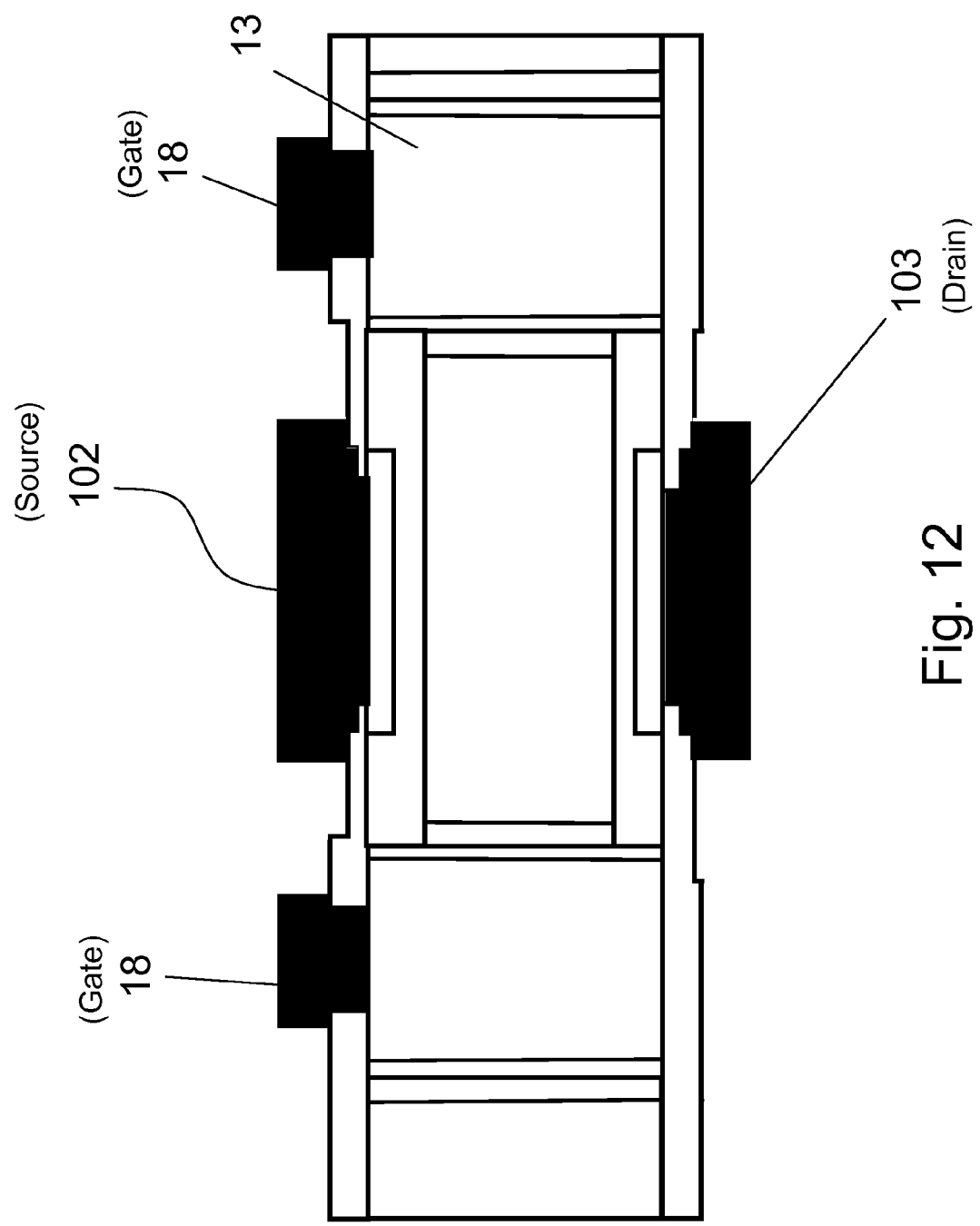

Finally, metal is deposited in the opened up regions to form the external contact pads 18, 102, 103 for gates, source and drain, respectively, as shown in FIG. 11-12. This final metallization formed by standard techniques of lithography and etching well known to the skilled man.

The substrate-through electrical connection having an on-off function according to the invention can be implemented in a semiconductor wafer, which thereby is usable as a starting substrate for semi-conductor engineering.

The substrate-through electrical connection having an on-off function can also be implemented in an interposer structure which is used for interconnecting components.

Thus, according to the invention there is provided for making MEMS devices in general comprising a substrate-through electrical connection having an on-off function according to the invention.

The invention claimed is:

1. A method of making a substrate-through electrical connection having an on-off function, comprising:
   providing a semiconductor substrate (40);
   etching a trench (42) in the semiconductor substrate to define said substrate-through electrical connection so that the trench surrounds the substrate-through electrical connection;
   after etching the trench, doping (15) the trench walls by diffusion masking and dopant diffusion to provide a threshold adjustment doping region;
   providing an insulating/dielectric layer (12) in the trench (42);
   filling the trench with a conductive or semi-conductive material (13) by depositing the material (13);
   removing the deposited material (13) from all areas except the trench area by means of standard techniques comprising etching and/or grinding so that the material (13) is only inside an area surrounded by the trench;
   thinning the substrate (40) from the opposite side from where the trench was made so as to expose the conductive or semi-conductive material (13) enclosed by the trench (42);
   providing both sides of the substrate with an insulation (76);
   doping the substrate-through electrical connection on a respective side of the substrate with an opposite doping type to that of the substrate to provide a source region (19t) and a drain region (19b), respectively;
   providing contacts (102, 103) to the substrate-through electrical connection on each side of the substrate, said contacts having the same doping as the source region (19t) and a drain region (19b), respectively;
   providing contact(s) (18) to the trench material on one side of the substrate, whereby
   the contacts to the substrate-through electrical connection form source and drain contacts, respectively, of a transistor, and the contact(s) to the trench material form(s) gate contacts of a transistor.

2. The method as claimed in claim 1, further comprising providing metal contacts to the source, drain and gate contacts respectively.

3. The method as claimed in claim 1, wherein the filling of the trenches with conductive material comprises filling with any of semi-conductor and metal.

4. A substrate-through electrical connection (10), comprising:
   a semiconductor substrate;
   a substrate-through via through the semiconductor substrate and made from material of the semiconductor substrate (10'); wherein
   a trench (11) in the semiconductor substrate that surrounds said via, the walls of said trench being coated with a layer of insulating material (12) and wherein the trench (11) has been filled with conductive or semi-conductive material (13);

a doping region (15) in the via material in the surface of the inner trench wall between the insulating material (12) and the material (10') in the via;

a doped top (19*t*) and bottom (19*b*) section, respectively, in the via, said sections having opposite doping compared with the via material;

wherein there is a contact doping (20) in said oppositely doped region, having the same doping type as the doped top (19*t*) and bottom (19*b*) sections, respectively; and contacts (17', 17") to the via on opposite sides of the substrate; and a contact (18) to the conductive material (13) in the trench (11) so as to enable the application of a voltage to the conductive material (13).

5. The substrate-through electrical connection as claimed in claim 4, further comprising an oxide layer (14) on the substrate whereby the contact (18) extends through the oxide layer and down to the poly silicon (13).

6. The substrate-through electrical connection as claimed in claim 4, in which one contact (17') forms a source of a transistor; another contact (17") forms a drain; a further contact (18) forms a gate.

7. The substrate-through electrical connection as claimed in claim 4, wherein the contacts (18) are provided along the entire trench (11).

8. The substrate-through electrical connection as claimed in claim 7, wherein the trench (11) is circular and the contact (18) is provided as a ring.

9. A starting substrate for semi-conductor engineering comprising a substrate-through electrical connection as claimed in claim 4.

10. A MEMS device comprising a substrate-through electrical connection as claimed in claim 4.

11. The device as claimed in claim 10, wherein the substrate-through electrical connection is provided in an interposer structure connecting two components.

12. The method as claimed in claim 1, wherein the step of depositing the material (13) is performed using a method selected from the group consisting of LPCVD, PECVD, MOCVD, PVD, ALD, electroplating, electroless plating, and melting.

13. The method as claimed in claim 1, wherein the deposited material (13) is one of a metal and a polysilicon.

\* \* \* \* \*